United States Patent [19]

Malladi

[11] Patent Number: 5,367,193
[45] Date of Patent: Nov. 22, 1994

[54] LOW COST, THERMALLY EFFICIENT, AND SURFACE MOUNTABLE SEMICONDUCTOR PACKAGE FOR A HIGH APPLIED POWER VLSI DIE

[75] Inventor: Deviprasad Malladi, Campbell, Calif.

[73] Assignee: Sun Microsystems, Inc., Mountain View, Calif.

[21] Appl. No.: 78,417

[22] Filed: Jun. 17, 1993

[51] Int. Cl.⁵ .......................................... H01L 23/02
[52] U.S. Cl. .................... 257/707; 257/706; 257/720; 361/707; 361/709; 361/714
[58] Field of Search ............... 257/706, 707, 737, 715, 257/717, 711, 719, 720; 361/688, 704, 707, 709, 714

[56] References Cited

U.S. PATENT DOCUMENTS

| | | | |
|---|---|---|---|
| 2,958,021 | 10/1960 | Cornelison et al. | 257/715 |
| 4,396,935 | 2/1983 | Schuck | 257/706 |
| 4,626,960 | 12/1986 | Hamano et al. | 257/706 |
| 4,651,192 | 3/1987 | Matsushita et al. | 257/707 |
| 4,712,159 | 12/1987 | Clemens | 361/704 |
| 4,745,456 | 5/1988 | Clemens | 257/717 |
| 4,912,548 | 3/1990 | Shanker et al. | 257/715 |
| 5,012,386 | 4/1991 | McShane et al. | 257/707 |
| 5,065,281 | 11/1991 | Hernandez et al. | 361/688 |
| 5,191,511 | 3/1993 | Sawaya | 257/737 |
| 5,227,663 | 7/1993 | Patil et al. | 257/706 |

FOREIGN PATENT DOCUMENTS

| | | | |
|---|---|---|---|
| 62-039039 | 2/1987 | Japan | 257/720 |
| 02224361 | 9/1990 | Japan | 257/718 |
| 03187295 | 8/1991 | Japan | 361/704 |

*Primary Examiner*—Sara W. Crane
*Assistant Examiner*—T. M. Arroyo
*Attorney, Agent, or Firm*—Blakely Sokoloff Taylor & Zafman

[57] ABSTRACT

A substrate, a heat slug with an access cavity, a lid, and a heat sink having a stem are used to package a high applied power VLSI die. The substrate comprises a stepped housing cavity at its center, and a number of electrical contacts disposed at its underside. The inactive side of the high applied power VLSI die, the top surface and underside openings of the stepped housing cavity of the substrate, the heat slug including its access cavity, the stem of the heat sink, and the lid are coordinated in their sizes and geometric locations in view of the applied power and the heat transfer efficiency of the heat sink. As a result, sufficient heat is directly transferred away from the high applied power VLSI die through only one layer of thermal adhesive material, thereby keeping the temperature in the stepped housing cavity of the substrate from rising above an unacceptable threshold, and yet the semiconductor package can still be assembled using industry standard unmodified wire bonding and surface mount equipment.

14 Claims, 3 Drawing Sheets

FIG _ 1
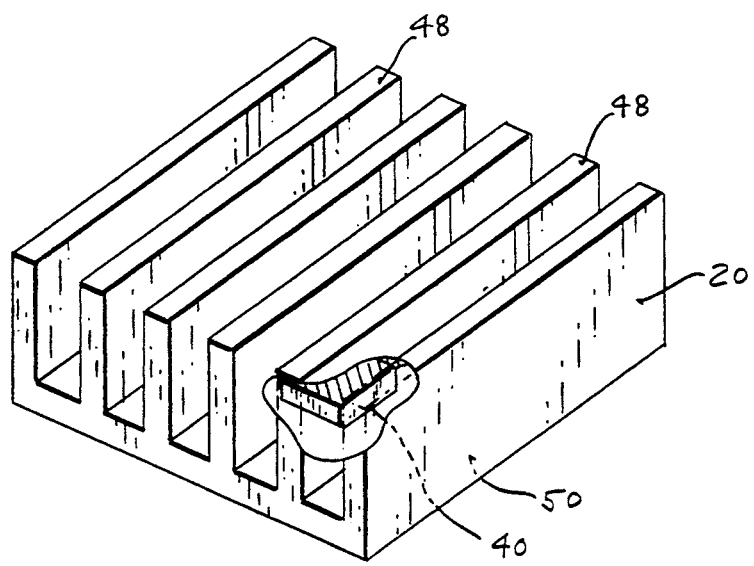
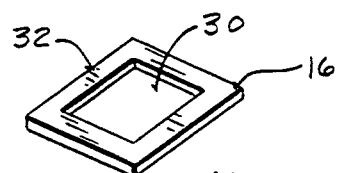
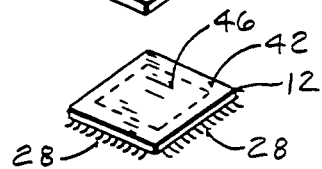
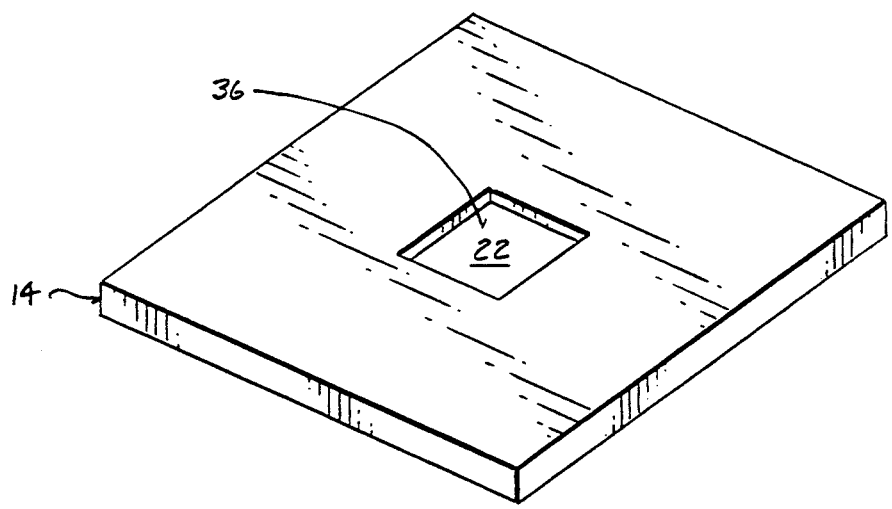
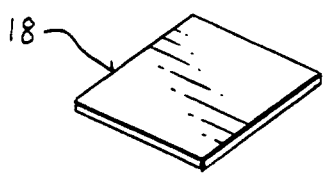

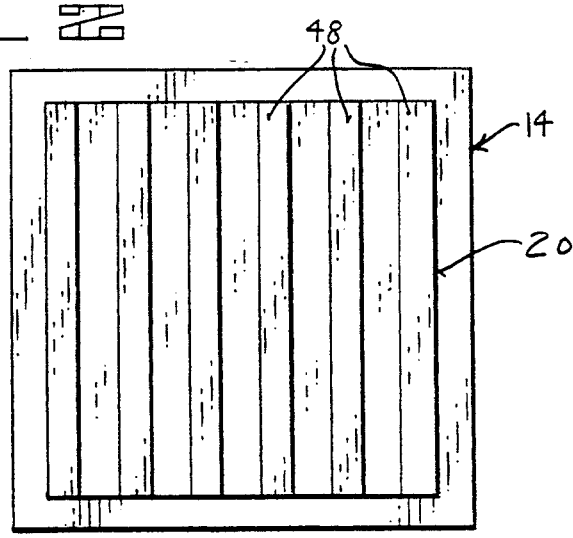
FIG_2
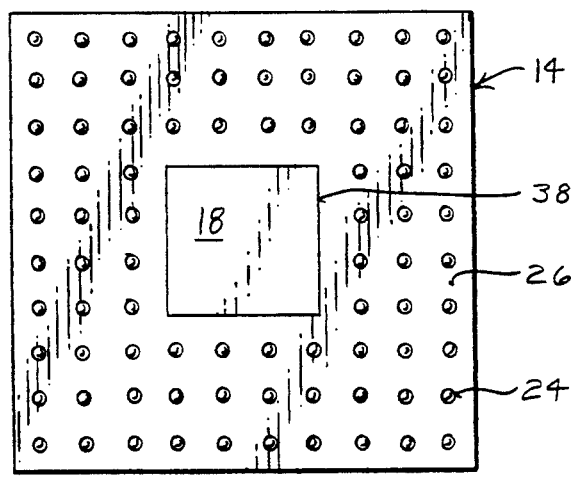
FIG_3
FIG_4
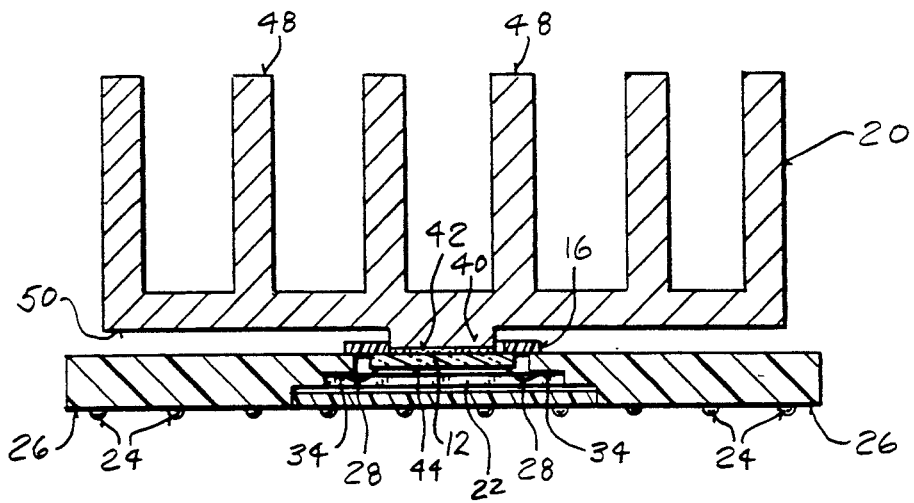

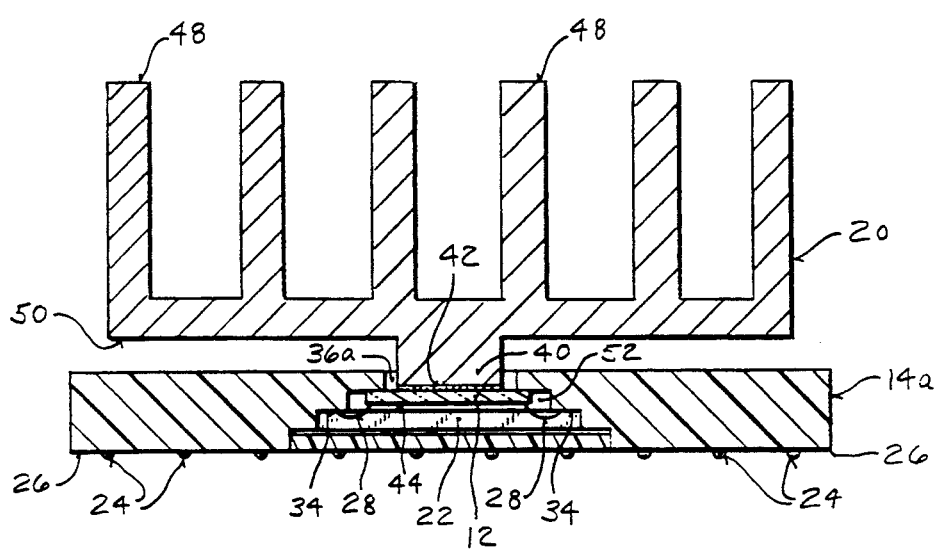
FIG_5

LOW COST, THERMALLY EFFICIENT, AND SURFACE MOUNTABLE SEMICONDUCTOR PACKAGE FOR A HIGH APPLIED POWER VLSI DIE

BACKGROUND OF THE INVENTION

1. Field of the Invention

The present invention relates to the field of semiconductor packaging, in particular, surface mountable packaging. More specifically, the present invention relates to packaging a high power very large scale integration (VLSI) semiconductor die in a thermally efficient and surface mountable manner.

2. Background

Surface mountable semiconductor packages including the relatively new ball grid array (BGA) packages are well known in the art of semiconductor packaging. The relatively new BGA packages take advantage of the more traditional pin grid array (PGA) design and surface mountable technology. Typically, a basic surface mountable semiconductor package comprises a VLSI die, a substrate, a heat slug, a lid, and a heat sink. The substrate has a stepped cavity at its center, and electrical contacts at its underside. The electrical contacts may be in either PGA or BGA format. The heat slug is first attached to the top side of the substrate using an adhesive material. The inactive side of the VLSI die is then attached to the underside of the heat slug using a first film of thermal adhesive, and the leads of the VLSI die are wire bonded to the substrate. Then the lid is attached to the cavity opening at the underside of the substrate protecting the active side of the VLSI die. The semiconductor package is then surface mounted to a printed wiring board (PWB) by joining the electrical contacts at the underside with complementary electrical contacts at a land pattern on the PWB. Lastly, the heat sink is attached to the top side of the heat slug with a second layer of thermal adhesive material.

Although thermal adhesive materials are used to attach the inactive side of the VLSI die and the heat sink to opposite sides the heat slugs, experience has shown that each layer of thermal adhesive material nevertheless increases the temperature in the enclosed cavity of the substrate by about 0.5 C./watt. Thus, for a VLSI die with 60 or 70 watts applied power, one layer of adhesive material increases the temperature in the enclosed cavity of the substrate by about 30 to 35 C. It is well known that heat generated by the VLSI die during operation is detrimental to the performance and reliability of the VLSI die as well as the neighboring electronic components. Various heat removal techniques including embedded heat pipes with air or fluid coolants are known in the art, and can be employed to lower the temperature in the enclosed cavity of the substrate. However, these techniques tend to increase the complexity and cost of the semiconductor package.

An alternate approach is to attach the heat sink to the top side of the substrate, and then attach the inactive side of the VLSI die to the heat sink directly. However, since wire bonding packaging equipment available today typically cannot handle a substrate with a large heat sink attached to it, either a different approach for bonding the leads of the VLSI die to the wiring planes of the substrate is provided or customized wire bonding equipment will have to be provided. Neither approaches are desirable. Additionally, even if the wire bonding equipment can be easily and cheaply modified to accommodate the attached heat sink, it still presents a problem to the surface mounting equipment. In particular, if the electrical contacts of the substrate are BGA bumps, the preattached heat sink will block the BGA bumps and prevent the surface mount equipment from focusing the laser beam on the bumps to solder them onto the land pattern of the PWB.

Thus, it is desirable to be able to package a high applied power VLSI die in a manner that is thermally efficient, surface mountable, and low cost. As will be disclosed, the present invention provides for such a semiconductor package which advantageously achieves the desired results.

SUMMARY OF THE INVENTION

The desired results are advantageously achieved by packaging a high applied power VLSI die with a substrate, a heat slug with an access cavity, a lid, and a heat sink having a stem. The substrate comprises a stepped housing cavity at its center, and a number of electrical contacts disposed at its underside. The inactive side of the high applied power VLSI die, the top surface and underside openings of the stepped housing cavity of the substrate, the heat slug including its access cavity, the stem of the heat sink, and the lid are coordinated in their sizes and geometric locations in view of the applied power and the heat conductivity efficiency of the heat sink.

The heat slug is first attached to the top side of the substrate across the top side opening of the stepped housing cavity of the substrate using an adhesive material. The high applied power VLSI die is attached to the unhollowed portions of the heat slug using a film of thermal adhesive material, and the leads of the high applied power VLSI die is wire bonded to the wiring plane of the PWB using standard unmodified wire bonding equipment. The lid is then attached to the underside opening of the stepped housing cavity of the substrate closing the underside opening and protecting the active side of the high applied power VLSI die. The substrate is then surface mounted to a land pattern of a PWB using standard unmodified surface mount equipment. Lastly, the heat sink is attached to the exposed inactive side of the high applied power VLSI die using a file of thermal adhesive material, with the stem contacting and transferring heat away directly through only one layer of thermal adhesive material.

In an alternate embodiment, the heat slug with an access cavity is integrated with the substrate as the topmost step of the substrate's stepped housing cavity. Under this embodiment, the high applied power VLSI die is directly attached to this topmost step of the substrate's stepped housing cavity instead, using a film of thermal adhesive material.

BRIEF DESCRIPTION OF THE DRAWINGS

The objects, features, and advantages of the present invention will be apparent from the following detailed description of the presently preferred and alternate embodiments of the invention with references to the drawings in which:

FIG. 1 is an exploded front perspective view of the low cost, thermally efficient, and surface mountable semiconductor package of the present invention.

FIG. 2 is the top view of the semiconductor package of the present invention.

FIG. 3 is the bottom view of the semiconductor package of the present invention.

FIG. 4 is a cross sectional view of the semiconductor package of the present invention.

FIG. 5 is a cross sectional view of an alternate embodiment of the semiconductor package of the present invention.

DETAILED DESCRIPTION PRESENTLY PREFERRED AND ALTERNATE EMBODIMENTS

In the following description, for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatical or block diagram form in order not to obscure the present invention unnecessarily.

Referring now to FIGS. 1-4, the semiconductor package of the present invention 10 comprises a VLSI die 12, a substrate 14, a heat slug 16, a lid 18, and a heat sink 20. The VLSI die 12 is provided with a large amount of electrical power W during operation. For the purpose of the present invention, W in excess of 60 watts is considered a large amount of electrical power. The VLSI die 12 has a number of bond pads 28 disposed along the outer edges of its active side 44. In actuality, the number of bond pads 28 is much more numerous than the number illustrated. While the present invention may be practiced with varying outside dimensions for the VLSI die 12, as will be obvious from the descriptions to follow, the outside dimensions of the VLSI die 12 must be sufficiently large to accommodate the support surface area 32 required by the heat slug 16 and the contact surface area 46 required by the heat sink 20. The support surface area 32 and the contact surface area 46 will be described in further detail below.

The substrate 14 comprises a housing cavity 22, at least one wiring plane (not shown), and a plurality of electrical contacts 24, for accommodating the VLSI die 12 and providing electrical contacts between the VLSI die 12 and the PWB (not shown). The substrate 14 is made of well known materials, such as polyimide, FR4, BT, and copper. The electrical contacts 24 are disposed at the underside 26 of the substrate 14. The electrical contacts 24 are suitable for mounting the semiconductor package 10 onto the PWB using surface mount technology. While BGA bumps are shown, it will be appreciated that the electrical contacts 24 may also be in PGA format. The housing cavity 22 comprises a plurality of steps with at least one step 34 partially exposing the at least one wiring plane. The stepped housing cavity 22 is disposed at the center of the substrate 14. The inside dimensions of the top surface opening 36 of the stepped housing cavity 22 are larger than the outside dimensions of the VLSI die 12, allowing the housing cavity 22 to accommodate the VLSI die 12 at its top surface opening 36.

The lid 18 closes the underside opening 38, thereby protecting the active side 44 of the VLSI die 12. The lid 18 may be made of a variety of well known non-fragile materials, such as ceramic and metal. The outside dimensions of the lid 18 are substantially the same as the inside dimensions of the underside opening 38 of the stepped housing cavity 22 of the substrate 14, allowing the lid 18 to be tightly fitted to the substrate 14 at the underside opening 38 of the stepped housing cavity 22. While the present invention is being described with a lid 18, as will be obvious from the descriptions to follow, the present invention may be practiced with or without the lid 18.

The heat slug 16 comprises a ring of support surface area 32, and an access cavity 30, for providing support to the VLSI die 12, and access to the inactive side 42 of the VLSI die 12 for direct heat removal. The heat slug 16 may be made of a variety of well known materials, preferably the material has high tensile strength and is thermally efficient, such as copper, copper alloy with tungsten or molybdenum. The ring of support surface area 32 and the access cavity 30 are disposed at the outer edges and the center of the heat slug 16 respectively. The outside dimensions of the heat slug 16 are larger than the inside dimensions of the housing cavity 22 of the substrate 14 to allow the heat slug 16 to be fitted across the top surface opening 36 of the substrate 14. The inside dimensions of the access cavity 30 of the heat slug 16 are smaller than the outside dimensions of the VLSI die 12, and the differences between the outside dimensions of the heat slug 16 and the inside dimensions of the access cavity 30 are sufficiently large to provide enough unhollowed support surface area 32 on the heat slug 16 to support the VLSI die 12 at the top surface opening 36 of the stepped cavity 22 of the substrate 14. At the same time, the inside dimensions of the access cavity 30 of the heat slug 16 are sufficiently large to expose enough surface area 46 of the inactive side 42 of the VLSI die 12 for making direct contact with the stem 40 of the heat sink 20 to allow heat to be removed at the required dissipation rate for keeping the temperature inside the closed stepped housing cavity 22 below an unacceptable threshold.

The heat sink 20 comprises a stem 40 for making direct contact with the exposed surface area 46 the inactive side 42 of the VLSI die 12, and removing heat generated by the VLSI die 12 during operation. While a fin type heat sink 20 is shown, it will be appreciated that the present invention may be practiced with heat sinks of other embodiments such as disk type heat sinks. Alternatively, a heat pipe may also be used. The heat sink 20 is made of a well known thermally conductive material, such as aluminum and copper, having a heat conductivity of K. The stem 40 is disposed at the underside 50 of the fin type heat sink 20. The outside dimensions of the stem 40 are smaller than the inside dimensions of the access cavity 30 of the heat slug 16, allowing the access cavity 30 to accommodate the stem 40 and the stem 40 to make direct contact with the inactive side 42 of the VLSI die 12. However, as described earlier, the outside dimensions of the stem 40 are sufficiently large to contact enough surface area 46 of the inactive side 44 of the VLSI die 12 to remove heat at the required dissipation rate for keeping the temperature inside the closed stepped housing cavity 22 below the unacceptable threshold.

The heat slug 16 is first attached to the substrate 14 across the top surface opening 36 of the stepped housing cavity 22 of the substrate 14 using a well known adhesive material such as epoxy, and reinforced by solder at the joint. The VLSI die 12 is then attached to the heat slug 16 using a similar adhesive material, and advantageously wire bonded to the at least one wiring plane of the substrate 14 using industry standard wire bonding semiconductor packaging equipment. After wire bonding, the housing cavity 22 is filled with a sealing material such as epoxy Blob Top. The lid 18 is then attached to the substrate 14 across the underside opening 38 of the stepped housing cavity 22 of the substrate 14, again using a similar adhesive material. The sealing is necessary to give strength to the VLSI die 12 to allow subsequent direct attachment of the heat sink 20 to the VLSI die 12. Other well known sealing techniques in the art may also be used. Next, the sealed semiconductor package less the heat sink 20 is advantageously surface mounted to a land pattern of a PWB using industry standard surface mount semiconductor packaging equipment. Finally, the heat sink 40 is advantageously attached to the exposed surface area 46 of the inactive side 42 of the VLSI die 12 using a thin layer of well known thermally conductive adhesive material, such as thermal compound 340, manufactured by Dow Corning of Midland, Mich. As a result, the heat sink 20 is advantageously removing heat from the VLSI die 12 through only one layer of thermal adhesive material.

In one embodiment, the electrical power W applied to the VLSI die 12 is in the order of 70 watts, and the outside dimensions of the VLSI die 12 are in the order of 14 mm×14 mm. The inside dimensions of the top surface opening 36 of the stepped housing cavity 22 are in the order of 13 mm×13 mm. The inside dimensions of the underside opening 38 of the stepped housing cavity 22 and the lid 18 are in the order of 21 mm×21 mm. The heat slug 16 is made of copper. The outside dimensions of the heat slug 16 and the inside dimensions of the access cavity 30 of the heat slug 16 are in the order of 24 mm×24 mm, and 13.2 mm×13.2 mm respectively. The heat sink 20 is made of aluminum having a thermal conductivity of 207 w/mK, the outside dimensions of fins 48 of the heat sink 20 are in the order of 4"×5"×0.8", and the outside dimensions of the stem 40 of the heat sink 20 are in the order of 13 mm×13 mm. A layer of Dow Corning 340 compound in the order of 0.001" thick is used to attach the heat sink 20 to the exposed surface area VLSI die 12. Experience has shown that with a 52 mm×52 mm×10 mm cooling fan, the temperature inside the stepped housing cavity 22 of the substrate 14 can be advantageously kept under 100 C., the unacceptable threshold, at ambient temperature (24 C.) sea level. Previous experience has shown that under the prior art, with a similar heat sink and a similar cooling fan, the temperature inside the stepped housing cavity 22 of the substrate 14 can be kept under 100 C., the unacceptable threshold, at ambient temperature sea level, only when the VLSI die 12 is smaller than 12 mm×12 mm and the electrical power W applied is less than 60 watts. (The amount of electronic components integrated in the VLSI die is proportionally less in the smaller 12 mm×12 mm VLSI die.)

Referring now to FIG. 5, a cross sectional view of an alternate embodiment of the present invention is illustrated. Under this alternate embodiment, the substrate 14a is fabricated with the heat slug 16 having an access cavity 30 integrated as the topmost step 52 of the stepped housing cavity 22. The sizes and geometric locations of the top surface opening 36a and the topmost step 52 of the stepped housing cavity 22 are coordinated with the heat sink stem 40 and the VLSI die 12 in a similar manner as the heat slug access cavity 30 and the substrate top surface opening 36 of the previously described embodiment. The VLSI die 12 is directly attached to this topmost step 52 of the stepped housing cavity 22 instead, using a film of thermal adhesive material. Otherwise, the semiconductor package 10 is advantageously assembled in the same manner as previously described.

While the present invention has been described in terms of presently preferred and alternate embodiments, those skilled in the art will recognize that the invention is not limited to the embodiments described. The method and apparatus of the present invention can be practiced with modification and alteration within the spirit and scope of the appended claims. The description is thus to be regarded as illustrative instead of limiting on the present invention.

What is claimed is:

1. A semiconductor package comprising:
   a) a VLSI semiconductor die having a plurality of electrical bond pads, an active side, an inactive side, and electrical power W applied to it during operation;
   b) a substrate having a housing cavity, at least one wiring plane, and a plurality of electrical contacts, for accommodating said VLSI die and electrically connecting said VLSI die to a PWB, said housing cavity being disposed at a center of said substrate having a top surface opening, an underside opening, and a plurality of steps, at least one of said steps exposing at least partially said at least one wiring plane, said VLSI die being accommodated at said top surface opening of said stepped housing cavity, wire bonded to said at least partially exposed at least one wiring plane, and sealed with a sealant material, said electrical contacts being suitable for surface mounting said semiconductor package onto said PWB;
   c) a heat slug having a ring of support surface area and an access cavity for supporting said VLSI die at said top surface opening of said stepped housing cavity and providing access to said inactive side of said VLSI die, said ring of support surface area of said heat slug, said top surface opening of said stepped housing cavity of said substrate, and said VLSI die being coordinated in sizes;
   d) a heat sink having a stem for accessing and contacting said inactive side of said VLSI die through said access cavity of said heat slug and removing heat generated by said VLSI die during operation, said heat sink being made of a thermally conductive material having a thermal conductivity of K, said VLSI die, said top surface opening of said stepped housing cavity of said substrate, said access cavity, and said stem being coordinated in sizes, allowing said stem to contact sufficient surface area of said inactive side of said VLSI die in view of said W and said K to remove heat at a sufficient dissipation rate to keep temperature in said stepped housing cavity of said substrate from rising above an unacceptable threshold during operation.

2. The semiconductor package as set forth in claim 1, wherein,
   said heat slug is first attached to said substrate across said top surface opening of said stepped housing cavity of said substrate;
   said VLSI die is then attached to said heat slug and said substrate by attaching said inactive side of said VLSI die to said ring of support surface area of said heat slug and wire bonding said electrical bond pads of said VLSI die to said at least partially exposed at least one wiring plane of said substrate;
   said housing cavity of said substrate is then filled with said sealant material;

said sealed semiconductor package less said heat sink is then attached to said PWB by surface mounting and connecting said electrical contacts of said substrate to a land pattern of said PWB; and said heat sink is then attached to said VLSI die by attaching said stem of said heat sink to said inactive side of said VLSI die using a film of thermally conductive adhesive material.

3. The semiconductor package as set forth in claim 2, wherein, said W is in the order of 70 watts;

said heat sink is made of aluminum, and said K is in the order of 207 w/mK;

said VLSI die has a first set of outside dimensions in the order of 14 mm×14 mm;

said top surface opening of said stepped housing cavity of said substrate has a first set of inside dimensions in the order of 21 mm×21 mm;

said heat slug is made of copper and has a second set of outside dimensions in the order of 24 mm×24 mm, said access cavity of said heat slug having a second set of inside dimensions in the order of 13.2 mm×13.2 mm; and said stem of said heat sink has a third set of outside dimensions in the order of 13 mm×13 mm.

4. The semiconductor package as set forth in claim 1 wherein said electrical contacts of said substrate are in BGA format.

5. The semiconductor package as set forth in claim 1, wherein said heat sink is a fin type heat sink.

6. The semiconductor package as set forth in claim 1 wherein, said semiconductor package further comprises:

e) a lid for closing said underside opening of said stepped housing cavity of said substrate and protecting said active side of said VLSI die, said lid and said underside opening of said stepped housing cavity of said substrate being coordinated in sizes.

7. The semiconductor package as set forth in claim 6, wherein, said lid is attached to said substrate across said underside opening of said stepped housing cavity of said substrate, after said housing cavity of said substrate has been filled with said sealant material.

8. A semiconductor package comprising:

a) a VLSI semiconductor die having a plurality of electrical bond pads, an active side, an inactive side, and electrical power W applied to it during operation;

b) a substrate having a housing cavity, at least one wiring plane, and a plurality of electrical contacts, for supporting and accommodating said VLSI die and electrically connecting said VLSI die to a PWB, said housing cavity being disposed at a center of said substrate having a top surface opening, an underside opening, and a plurality of steps, at least one of said steps exposing at least partially said at least one wiring plane, said VLSI die being accommodated at a topmost step of said stepped housing cavity, wire bonded to said at least partially exposed at least one wiring plane, and sealed with a sealant material, said electrical contacts being suitable for surface mounting said semiconductor package onto said PWB, said top surface opening and topmost step of said stepped housing cavity of said substrate and said VLSI die being coordinated in sizes;

c) a heat sink having a stem for accessing and contacting said inactive side of said VLSI die through said top surface opening of said substrate and removing heat generated by said VLSI die during operation, said heat sink being made of a thermally conductive material having a thermal conductivity of K, said VLSI die, said top surface opening of said stepped housing cavity of said substrate and said stem being coordinated in sizes, allowing said stem to contact sufficient surface area of said inactive side of said VLSI die in view of said W and said K to remove heat at a sufficient dissipation rate to keep temperature in said stepped housing cavity of said substrate from rising above an unacceptable threshold during operation.

9. The semiconductor package as set forth in claim 8, wherein, said VLSI die is attached to said substrate by attaching said inactive side of said VLSI die to said topmost step of said substrate and wire bonding said electrical bond pads of said VLSI die to said at least partially exposed at least one wiring plane of said substrate;

said housing cavity of said substrate is then filled with said sealant material;

said sealed semiconductor package less said heat sink is then attached to said PWB by surface mounting and connecting said electrical contacts of said substrate to a land pattern of said PWB; and said heat sink is then attached to said VLSI die by attaching said stem of said heat sink to said inactive side of said VLSI die using a film of thermally conductive adhesive material.

10. The semiconductor package as set forth in claim 9, wherein, said W is in the order of 70 watts;

said heat sink is made of aluminum, and said K is in the order of 207 w/mK;

said VLSI die has a first set of outside dimensions in the order of 14 mm×14 mm;

said topmost step of said stepped housing cavity of said substrate has a first set of inside dimensions in the order of 21 mm×21 mm;

said top surface opening of said substrate has a second set of inside dimensions in the order of 13.2 mm×13.2 mm; and said stem of said heat sink has a third set of outside dimensions in the order of 13 mm×13 mm.

11. The semiconductor package as set forth in claim 8, wherein said electrical contacts of said substrate are in BGA format.

12. The semiconductor package as set forth in claim 8, wherein said heat sink is a fin type heat sink.

13. The semiconductor package as set forth in claim 8, wherein, said semiconductor package further comprises:

d) a lid for closing said underside opening of said stepped housing cavity of said substrate and protecting said active side of said VLSI die, said lid and said underside opening of said stepped housing cavity of said substrate being coordinated in sizes.

14. The semiconductor package as set forth in claim 13, wherein, said lid is attached to said substrate across said underside opening of said stepped housing cavity of said substrate, after said housing cavity of said substrate has been filled with said sealant material.

* * * * *